US007289165B1

(12) United States Patent
Ott

(10) Patent No.: US 7,289,165 B1
(45) Date of Patent: Oct. 30, 2007

(54) SELF-DIRECTING BUS AMPLIFIER AND METHOD

(75) Inventor: Arthur Richard Ott, White Rock (CA)

(73) Assignee: Cybermation Systems, Inc., Richmond, B.C. (CA)

( * ) Notice: Subject to any disclaimer, the term of this patent is extended or adjusted under 35 U.S.C. 154(b) by 783 days.

(21) Appl. No.: 10/775,610

(22) Filed: Feb. 10, 2004

(51) Int. Cl.
*H04N 5/268* (2006.01)

(52) U.S. Cl. .................. 348/705; 348/211.11; 348/707; 330/51; 370/402; 370/362

(58) Field of Classification Search .............. 348/705, 348/707, 706, 211.5, 211.11; 370/450, 451, 370/257, 362, 364, 402, 421, 219; 330/51; 307/112, 113, 114, 115, 116; 327/330
See application file for complete search history.

(56) References Cited

U.S. PATENT DOCUMENTS 5,086,427 A * 2/1992 Whittaker et al. .......... 370/462
5,418,935 A * 5/1995 Whittaker et al. .......... 710/119
6,556,075 B1 * 4/2003 Jordan ........................ 330/51
7,068,073 B2 * 6/2006 Benson ........................ 326/63
2004/0228475 A1 * 11/2004 Scott et al. ................. 379/412
2006/0012411 A1 * 1/2006 De Langen ................ 327/170

* cited by examiner

*Primary Examiner*—Lin Ye
*Assistant Examiner*—Nelson D. Hernandez
(74) *Attorney, Agent, or Firm*—J. Nevin Shaffer, Jr.; Ron Richebourg

(57) ABSTRACT

A self-directing bus amplifier and method is disclosed, which includes an input biased at a given voltage level and a tri-state amplifier with a first input terminal coupled to the biased input and an output coupled to an output bus. A field effect transistor with a gate terminal coupled to the biased input and a source terminal coupled to ground potential with a drain terminal coupled to an inhibiting input of the tri-state amplifier. The drain terminal of the field effect transistor is biased, such that when a signal is present on the input the field effect transistor turns OFF, which enables the tri-state amplifier so that the signal is passed through to the output bus.

23 Claims, 3 Drawing Sheets

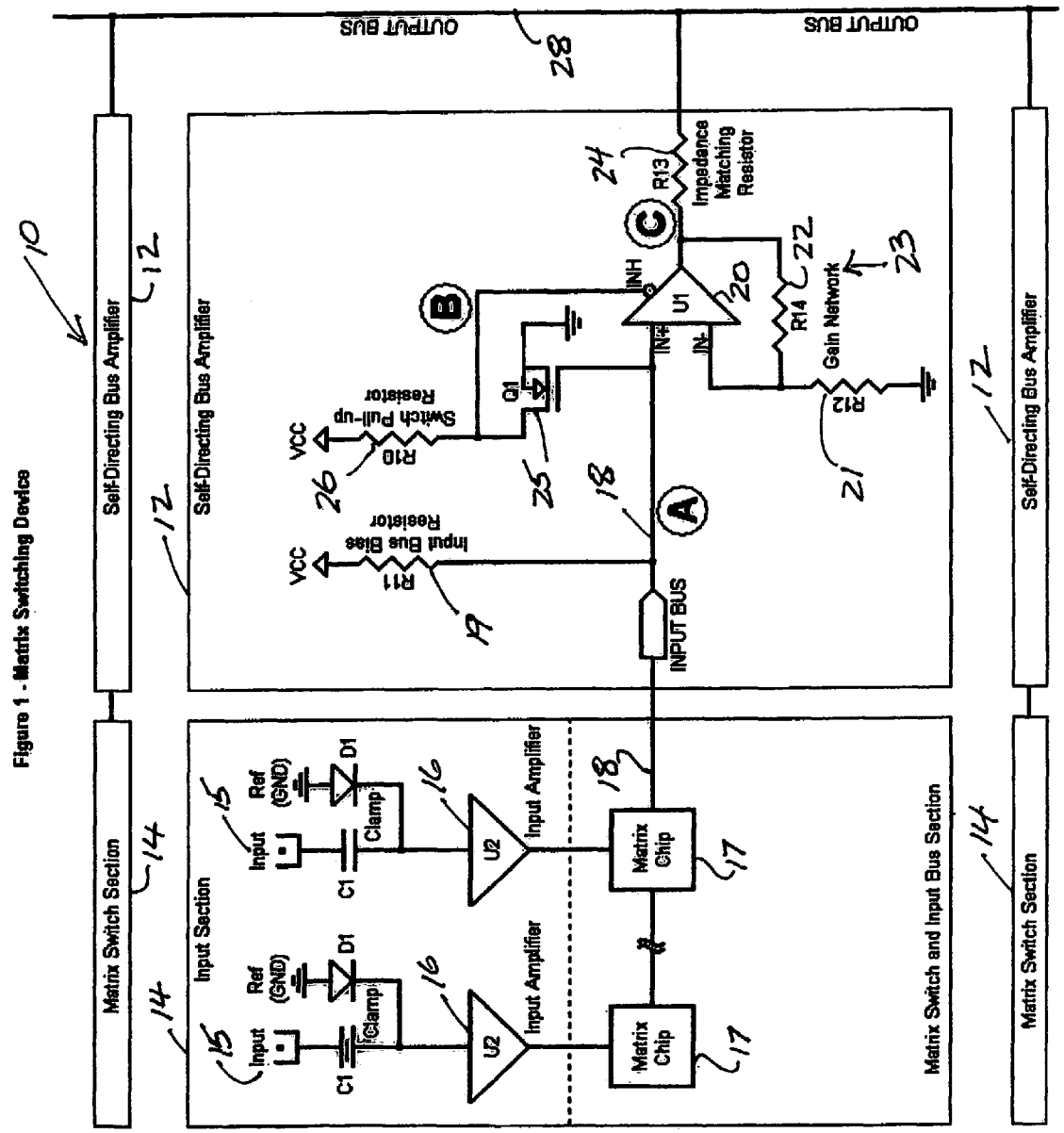
Figure 1 - Matrix Switching Device

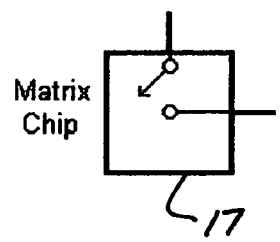
Figure 2 - Off State

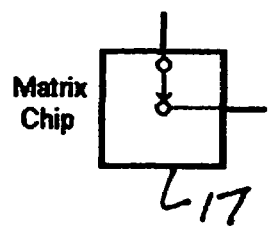
Figure 3 - On State

SELF-DIRECTING BUS AMPLIFIER AND METHOD

FIELD OF THE INVENTION

The present invention generally relates to the field of video switching and routing circuitry and in particular to a self-directing bus amplifier and method useful in such circuitry.

BACKGROUND OF THE INVENTION

In recent years the close circuit television (CCTV) industry has grown tremendously, with the likelihood of continued growth in future years. Future growth could enable the CCTV industry to provide hundreds, possibly thousands of intelligent transportation systems (ITS) and security systems to be installed. As the CCTV and security industry base grows, it has become increasingly important to minimize breakdowns in security systems in order to avoid loss of protection to customers. One way to accomplish this is to simplify circuits and to minimize the number of circuit components required to achieve a given function.

In the art of video switching technology, it is typical to switch from a wide array of signal sources to a single output bus or buses in series, such as a bus structure coupled to a single video monitor or to a broadcast channel. Various routing switchers are available in the marketplace, and these switchers often include complicated switching circuitry or dedicated control logic circuits for switching from a large number of input sources to a series of output buses. More particularly, the problem faced was one of designing complex logic control of multiple matrix buffer amplifiers sharing the same bus structure.

Such applications require the ability of the bus drivers to apply video signals from intermediate buses to the output bus with a relatively low source or sink impedance and to isolate video signals from the bus with a relatively high "off state" impedance. Such a characteristic is called a "tri-state" operation because three drive conditions are possible comprising: (1) supplying or "sourcing" current to the bus with a low impedance, (2) removing or "sinking" current from the bus with a low impedance or (3) isolating or de-coupling the video signal from the bus with a very high impedance, essentially an open circuit.

Hence, it is desirable to provide a simpler and more reliable circuit that is capable of switching from numerous inputs on an intermediate bus to a common output bus handling the signals from a number of intermediate buses without the need for dedicated control logic. One such example is the System6E Matrix Routing Switcher, manufactured by Cybermation Systems, Inc. of British Columbia, Canada, the assignee hereof. The System6E Video Routing Switcher is capable of full matrix switching 1280 inputs by 256 outputs in one single device. In order to accomplish this, a new self-directing bus buffering circuit is needed.

SUMMARY OF THE INVENTION

As will be set forth more fully hereinbelow, the present invention solves one of the prior art problems by providing a simplified self-directing bus amplifier that obviates the need for complicated dedicated control logic.

Accordingly, it is an object of the present invention to provide a new and improved, yet simple to manufacture, self-directing bus amplifier and method.

Another object of the present invention is to enable the ability to provide buffering of an input matrix bus, which may receive a multiplicity of disparate input signals, to a common output bus using only the existing matrix chip logic circuitry. This arrangement enables the building of multiple bay and rack unit routing switchers with a minimum number of amplifier stages and concomitant control logic.

Moreover, the circuit of the present invention is useful in any application where multiple signal paths are buffered to a common bus by manipulation of the input bias voltage.

An advantage of the circuit of the present invention is its ability to self-connect to an output bus depending upon the input bus voltage conditions.

Yet another advantage of the circuit of the present invention is that the input matrix chip routing is not affected by the addition of the self-directed bus amplifier. These and other objects of the invention will become apparent as the invention is described in detail below.

According to one aspect of the invention, a self-directing bus amplifier includes an input biased at a given voltage level and a tri-state amplifier with a first input terminal coupled to the biased input. A field effect transistor with a gate terminal coupled to the biased input and a source terminal coupled to ground potential with a drain terminal coupled to an inhibiting input of the tri-state amplifier. The drain terminal of the field effect transistor is biased, such that when a signal is present on the input the field effect transistor turns OFF, which enables the tri-state amplifier so that the signal is passed through to an output bus. Opposite polarity switching is possible using selected parts.

Still other objects, features and advantages of the present invention will become readily apparent to those skilled in the art from the following detailed description, wherein is shown and described only the preferred embodiment of the invention, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims. The present invention will become apparent when taken in conjunction with the following description and attached drawings, wherein like characters indicate like parts, and which drawings form a part of this application.

BRIEF DESCRIPTION OF THE DRAWINGS

FIG. 1 is a schematic diagram of a portion of a video switching and routing circuit including the self-directing bus amplifier of the present invention.

FIG. 2 is a voltage level diagram illustrating circuit performance in an OFF state.

FIG. 3 is a voltage level diagram illustrating circuit performance in an ON state.

DETAILED DESCRIPTION OF ONE EMBODIMENT

Referring now to the drawings and to FIG. 1 in particular, a schematic diagram of a part of a video switching and routing circuit 10, which includes the self-directing bus amplifier 12 of the present invention, is shown. The circuit 10 includes a plurality of matrix switches 14, each of which includes an input terminal 15 coupled to an input amplifier

16. The output terminal of each input amplifier 16 is coupled to a matrix chip 17, which is essentially a switch, as will be described further hereafter.

The output of each matrix chip 17 is coupled to an input bus 18 (at a circuit node A), which is coupled to an input of the self-directing amplifier 12. The input bus 18 is biased to VCC, which is typically 5 volts in one embodiment, through a pull-up resistor 19. The input bus 18 is also coupled to the non-inverting (i.e., positive) input terminal (IN+) of an amplifier 20. The amplifier 20 is a tri-state OP AMP, and in accordance with one embodiment may be a MAX 4380, which is available from Dallas Semiconductor. The inverting (i.e., negative) input terminal (IN−) of the amplifier 20 is coupled to a junction of two resistors 21 and 22, which form a gain network 23. That is, the values of the resistors 21 and 22 set the gain of the amplifier 20. The second end of the resistor 21 is coupled to ground potential and the second end of the resistor 22 is coupled to the output terminal of the amplifier 20 (at a circuit node C). The output terminal of the amplifier 20 is also coupled to an output bus 28 through an impedance matching resistor 24. That is, the value of the resistor 24 determines the output impedance of the amplifier 20.

A Field Effect Transistor 25, which in this example is an N-channel FET typically a 2N 7002LT1, manufactured by Motorola Semiconductor, having a gate terminal thereof coupled to the positive input terminal (IN+) of the amplifier 20 and the input bus 18. The drain terminal of the FET 25 is coupled to ground potential and the drain terminal thereof is coupled to VCC through a switch pull-up resistor 26. The source terminal of the FET 25 is also coupled to the inhibiting (INH) input terminal of the amplifier 20 (at a circuit node B). The INH input terminal of the amplifier 20 controls the output thereof. When the FET 25 is turned ON the voltage applied to the INH input terminal is low (e.g., ground potential) and the output at the circuit node C goes into high impedance. Conversely, when the FET is OFF the voltage applied to the INH input terminal is high (e.g., VCC) and the amplifier 20 is enabled and the signal appearing at the IN+ input terminal is passed therethrough with a gain determined by the network 23.

As will be discussed more fully hereafter, when there is no signal on the input bus 18, it is biased to the voltage level of VCC through the resistor 19. The FET 25 is turned ON and ground potential is applied to the INH input terminal. Hence, the output of the amplifier 20 is at an undetermined high impedance. This isolates the amplifier 20 and all the matrix chips coupled thereto from the output bus 28, which is desired since only one signal may appear on the output bus 28 at any single point in time. In other words, only one video signal may be present on the output bus 28 at a time.

For example only and not by way of limitation, when a video signal is provided on the input bus 18, which begins with ground potential (as may be seen in FIG. 3), the FET 25 is turned OFF, which applies VCC to the INH input of the amplifier 20 thereby allowing the input signal to be passed through the amplifier to the output bus 28 unaltered, except with a limited amount of amplification as determined by the gain network 23. It should be understood by this example that other signals are applicable to the invention including any audio, digital, or electronic signals now know or hereafter developed.

Referring now to FIG. 2, a voltage level diagram illustrates circuit performance when the matrix chips 17 are off, that is when there is no video signal present on the input bus 18. Waveform A, which corresponds to circuit node A in FIG. 1, illustrates the input bus voltage level at VCC via the resistor 19. Waveform B, which corresponds to the circuit node B in FIG. 1, illustrates the voltage level on the drain terminal of the FET 25 and the INH input terminal of the amplifier 20 to be equal to ground potential. Waveform C, which corresponds to the circuit node C in FIG. 1, illustrates the voltage level at the output of the amplifier 20 is at an undetermined high impedance level, thereby effectively disconnecting the amplifier 20 from the output bus 28.

Referring now to FIG. 3, a voltage level diagram illustrates circuit performance when one of the matrix chips 17 is ON, that is when there is a video signal present on the input bus 18. Waveform A, which corresponds to the circuit node A in FIG. 1, illustrates the video signal present on the input bus 18. When the voltage level present on the gate terminal of the FET 25 drops below a specified threshold level (at approximately 2.5 volts, i.e., VCC/2) the FET 25 turns OFF, which applies VCC potential to the circuit node B in FIG. 1. Accordingly, waveform B illustrates the voltage level applied to the INH input terminal of the amplifier 20 to be equal to VCC. This turns the amplifier 20 ON, which allows the input video signal to be passed through to the output bus 28. Hence, the waveform C depicts the same video signal that was applied to the positive input terminal of the amplifier 20, except for a certain amount of gain as determined by the gain network 23. Note that the peak level of the waveforms A and C reach a potential equal to approximately one-half of VCC (i.e., VCC/2), which is at or below the threshold level that turns ON the FET 25.

Although the invention has been described with reference to a specific embodiment, this description is not meant to be construed in a limiting sense. Various modifications of the disclosed embodiment as well as alternative embodiments of the invention will become apparent to one skilled in the art upon reference to the description of the invention. It is therefore contemplated that the appended claims will cover any such modifications of embodiments that fall within the true scope of the invention.

What is claimed is:

1. A self-directing bus amplifier circuit comprising:
   a. an input biased at a given voltage level;
   b. a tri-state amplifier having a first input terminal coupled to said biased input and having an output coupled to an output bus;
   c. a field effect transistor having a gate terminal coupled to said biased input, a source terminal coupled to ground potential, and a drain terminal coupled to an inhibiting input of said amplifier; and
   d. said drain terminal of said field effect transistor coupled to a source of voltage for bias thereof, such that when a signal is present on said input said field effect transistor turns OFF, which enables said tri-state amplifier so that said signal is passed through to said output bus.

2. The circuit as in claim 1 wherein said field effect transistor is an N channel device.

3. The circuit as in claim 1 wherein said tri-state amplifier is an OP AMP having an inhibiting input thereof.

4. The circuit as in claim 1 wherein said input is biased at a given level by means of a resistor coupled between said input and source voltage.

5. The circuit as in claim 1 wherein said drain terminal of said field effect transistor is biased at a given level by means of a resistor coupled between said drain terminal and source voltage.

6. The circuit as in claim 1 wherein a resistor is coupled between the output of said tri-state amplifier and said output bus for controlling the output impedance of said self-directing amplifier.

7. The circuit as in claim 1 wherein a gain network is coupled between a second input terminal of said tri-state amplifier and the output thereof.

8. A self-directing bus amplifier circuit comprising:
 a. an input biased at a given voltage level;
 b. a tri-state amplifier having a first input terminal coupled to said biased input and having an output coupled to an output bus;
 c. a field effect transistor having a gate terminal coupled to said biased input, a source terminal coupled to ground potential, and a drain terminal coupled to an inhibiting input of said amplifier; and
 d. said drain terminal of said field effect transistor coupled to a source of voltage for bias thereof, such that when a signal is present on said input said field effect transistor turns OFF, which enables said tri-state amplifier so that said signal is passed through to said output bus;
 e. wherein said input is biased at a given level by means of a resistor coupled between said input and source voltage.

9. The circuit as in claim 8 wherein said field effect transistor is an N channel device.

10. The circuit as in claim 8 wherein said tri-state amplifier is an OP AMP having an inhibiting input thereof.

11. The circuit as in claim 8 wherein said drain terminal of said field effect transistor is biased at a given level by means of a resistor coupled between said drain terminal and source voltage.

12. The circuit as in claim 8 wherein a resistor is coupled between the output of said tri-state amplifier and said output bus for controlling the output impedance of said self-directing amplifier.

13. The circuit as in claim 8 wherein a gain network is coupled between a second input terminal of said tri-state amplifier and the output thereof.

14. A self-directing bus amplifier circuit comprising:
 a. an input biased at a given voltage level;
 b. a tri-state amplifier having a first input terminal coupled to said biased input and having an output coupled to an output bus;
 c. a field effect transistor having a gate terminal coupled to said biased input, a source terminal coupled to ground potential, and a drain terminal coupled to an inhibiting input of said amplifier; and
 d. said drain terminal of said field effect transistor coupled to a source of voltage for bias thereof, such that when a signal is present on said input said field effect transistor turns OFF, which enables said tri-state amplifier so that said signal is passed through to said output bus;
 e. wherein said input is biased at a given level by means of a resistor coupled between said input and source voltage; and
 f. wherein said drain terminal of said field effect transistor is biased at a given level by means of a resistor coupled between said drain terminal and source voltage.

15. The circuit as in claim 14 wherein said field effect transistor is an N channel device.

16. The circuit as in claim 14 wherein said tri-state amplifier is an OP AMP having an inhibiting input thereof.

17. The circuit as in claim 14 wherein a resistor is coupled between the output of said tri-state amplifier and said output bus for controlling the output impedance of said self-directing amplifier.

18. The circuit as in claim 14 wherein a gain network is coupled between a second input terminal of said tri-state amplifier and the output thereof.

19. In a video matrix routing switcher, a method for isolating a source of video signals on an input bus from an output bus, said method comprising:
 a. providing an input biased at a given voltage level;
 b. coupling a tri-state amplifier having a first input terminal between said biased input and an output bus;
 c. coupling a gate terminal of a field effect transistor to said biased input, coupling a source terminal thereof to ground potential, and coupling a drain terminal to an inhibiting input of said amplifier;
 d. coupling said drain terminal of said field effect transistor to a source of voltage for bias thereof;
 e. providing a signal on said input, which turns off said field effect transistor thereby enabling said tri-state amplifier so that said signal is passed through to said output bus.

20. The circuit method as in claim 19 wherein said input is biased at a given level by means of coupling a resistor between said input and source voltage.

21. The circuit method as in claim 19 wherein said drain terminal of said field effect transistor is biased at a given level by means of coupling a resistor between said drain terminal and source voltage.

22. The circuit method as in claim 19 further comprising the step of coupling a resistor between the output of said tri-state amplifier and said output bus for controlling the output impedance of said self-directing amplifier.

23. The circuit method as in claim 19 further comprising the step of coupling a gain network between a second input terminal of said tri-state amplifier and the output thereof.

* * * * *